US005576543A

United States Patent [19]
Dingley

[11] Patent Number: 5,576,543
[45] Date of Patent: Nov. 19, 1996

[54] METHOD AND APPARATUS FOR DETERMINING CRYSTALLOGRAPHIC CHARACTERISTICS

[75] Inventor: David J. Dingley, Provo, Utah

[73] Assignee: TexSEM Laboratories, Inc., Provo, Utah

[21] Appl. No.: 517,146

[22] Filed: Aug. 21, 1995

[51] Int. Cl.[6] .................................................. H01J 37/26
[52] U.S. Cl. ................................................ 250/311
[58] Field of Search ................................ 250/311, 306, 250/307, 396 R

[56] References Cited

U.S. PATENT DOCUMENTS

| 4,608,491 | 8/1986 | Kokubo ................................. | 250/311 |
| 5,453,617 | 9/1995 | Tsuneta et al. ....................... | 250/311 |

OTHER PUBLICATIONS

Experimental Techniques for Microtexture Determination, Eighth International Conference on Textures by Materials (ICOTOM 8) The Metallurgical Society, 1988, pp. 171–182. No Month.

Metallurgical Transactions A vol. 24A, Apr. 1993; Orientation Inaging: The Emergence of a New Microscopy. Brent L. Adams, Stuart I. Wright and Karsten Kunze. pp. 819–831.

Journal of Computer Assisted Microscopy; vol. 5 No. 3, 1993. A Review of Automated Orientation Imaging Microscopy (OIM)[1] Stuart I. Wright. pp. 207–221. No Month.

Primary Examiner—Jack I. Berman
Assistant Examiner—Kiet Nguyen
Attorney, Agent, or Firm—Meschkow & Gresham P.L.C.

[57] ABSTRACT

An apparatus for determining crystallographic characteristics of a specimen having at least one crystal includes an electron beam generator, a beam deflector for adjusting the tilt and azimuth angles of the electron beam relative to the specimen, a stage for holding the specimen, an image collection system for obtaining a plurality of dark field images, a data store, and a processor for processing the dark field images to identify a plurality of crystal lattice planes associated with the crystals. The dark field images are obtained under different electron beam tilt and azimuth deflection conditions. The bright pixels in each dark field image are identified and utilized to determine the spatial location and orientation of the crystal lattice planes and the crystals themselves. An orientation image is produced that represents the orientation of the crystals within the specimen.

20 Claims, 4 Drawing Sheets

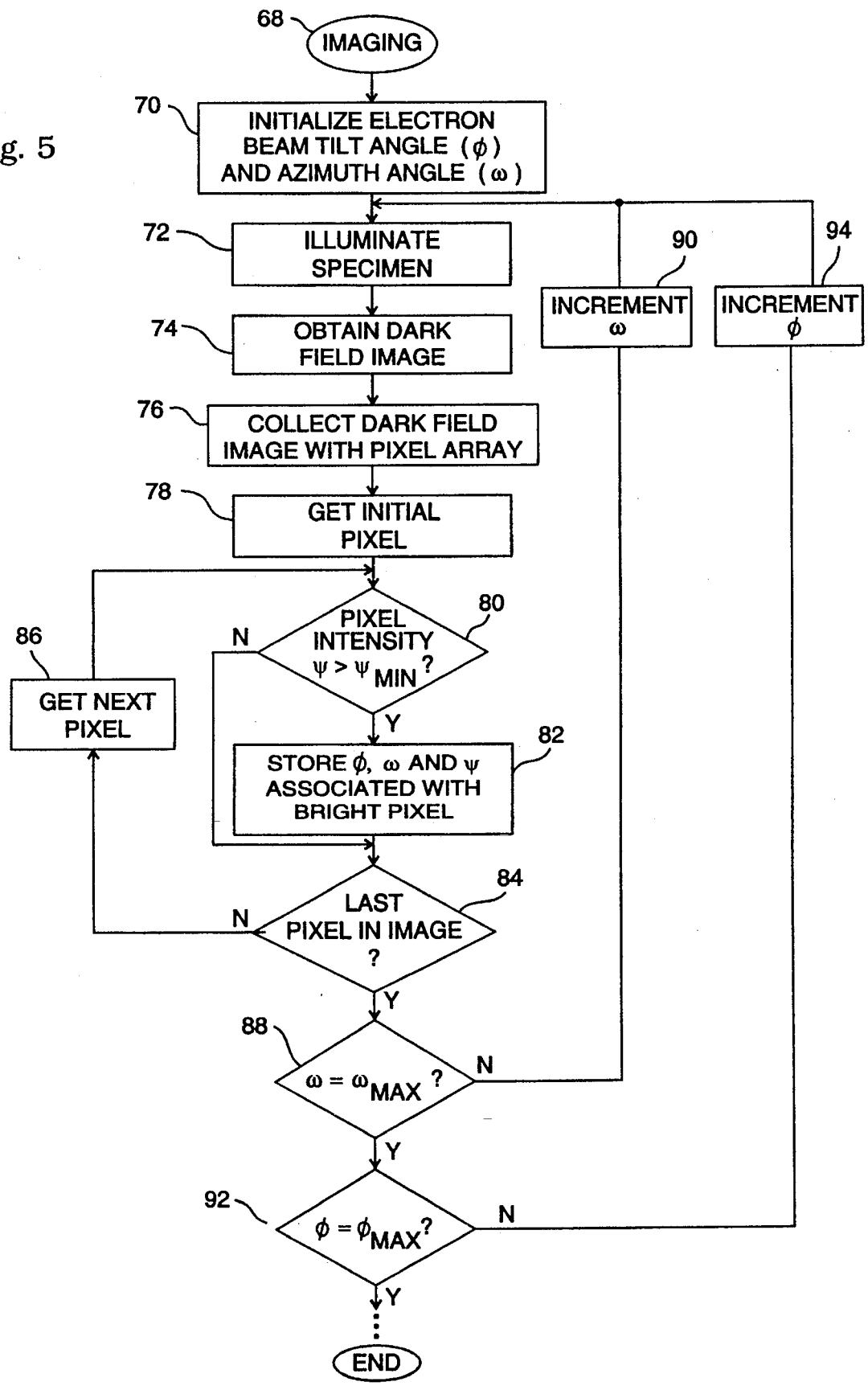

METHOD AND APPARATUS FOR DETERMINING CRYSTALLOGRAPHIC CHARACTERISTICS

TECHNICAL FIELD OF THE INVENTION

The present invention is related in general to material sciences. In particular, the present invention is related to the determination of crystallographic characteristics of a material utilizing dark field images obtained from a transmission electron microscope.

BACKGROUND OF THE INVENTION

Crystallographic characteristics such as orientation and defects are important properties of a polycrystalline material. If known, the crystal characteristics of a material can be very useful to scientists, engineers, and others who use the material for practical applications. For this reason, several techniques have been developed to determine the crystal orientation and other characteristics of a material specimen.

Orientation imaging microscopy (OIM) is one technique that may be utilized to determine the crystal orientation of a polycrystalline material. Generally, OIM involves directing an electron beam at the surface of a specimen. The crystals within the specimen cause the electron beam to form diffraction patterns, which are collected on an imaging or video screen. Such patterns are typically called electron backscatter diffraction patterns (EBSPs). The EBSPs are processed to generate maps that represent the crystal orientation of the specimen. These maps contain important information related to the microstructure of the material.

Although conventional OIM may be adequate for many applications, the usefulness of the technique may be limited by the imaging or measuring equipment. For example, conventional OIM is performed with a scanning electron microscope (SEM), which has a practical resolution of about 400–500 angstroms. While the SEM resolution may be satisfactory for some applications, other applications may require resolution beyond the practical capability of a SEM.

Another known technique for measuring the crystal orientation of a specimen utilizes a transmission electron microscope (TEM) to generate diffraction patterns. Diffraction patterns may appear as bright concentric rings, which are caused by the diffraction of a relatively wide electron beam by many crystals, or as a number of equiradial bright spots, which are caused by the diffraction of a relatively narrow electron beam by a single crystal. The conventional TEM-based crystal orientation technique analyzes the diffraction patterns for individual crystals to determine their specific orientation within the specimen.

A useful and practical crystal orientation map typically includes information related to hundreds of individual crystals. Such a map may reveal information related to microstructure, grain boundaries, and other characteristics that cannot be revealed by the orientation of an individual crystal or a small group of crystals. The conventional TEM-based technique can be painstakingly time consuming if a large number of individual crystals must be analyzed and the results combined to generate a useful orientation map. Even if such a process were automated, the serial acquisition and manipulation of data may be undesirably slow for practical purposes.

SUMMARY OF THE INVENTION

Accordingly, it is an advantage of the present invention that an improved method and apparatus for determining crystallographic characteristics of a material are provided.

Another advantage is that the crystal orientation of a material can be determined with a resolution beyond the practical limits of a scanning electron microscope.

A further advantage is that the present invention can determine the orientation of a large number of crystals within a material in a relatively short time.

The present invention also provides a method for determining the orientation of a large number of crystals within a material that utilizes parallel data acquisition and manipulation.

Another advantage of the present invention is that it may be utilized to detect and analyze defects within a material specimen.

The above and other advantages of the present invention can be carried out in one form by a method for determining crystallographic characteristics of a specimen having at least one crystal. The method involves obtaining a plurality of dark field images of the specimen, defining a plurality of image regions for each dark field image, and analyzing the image regions to identify the crystal lattice planes associated with the crystals.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 5 is a flow diagram of an imaging process performed by the orientation apparatus;

DETAILED DESCRIPTION OF THE PREFERRED EMBODIMENT

Figure 1:
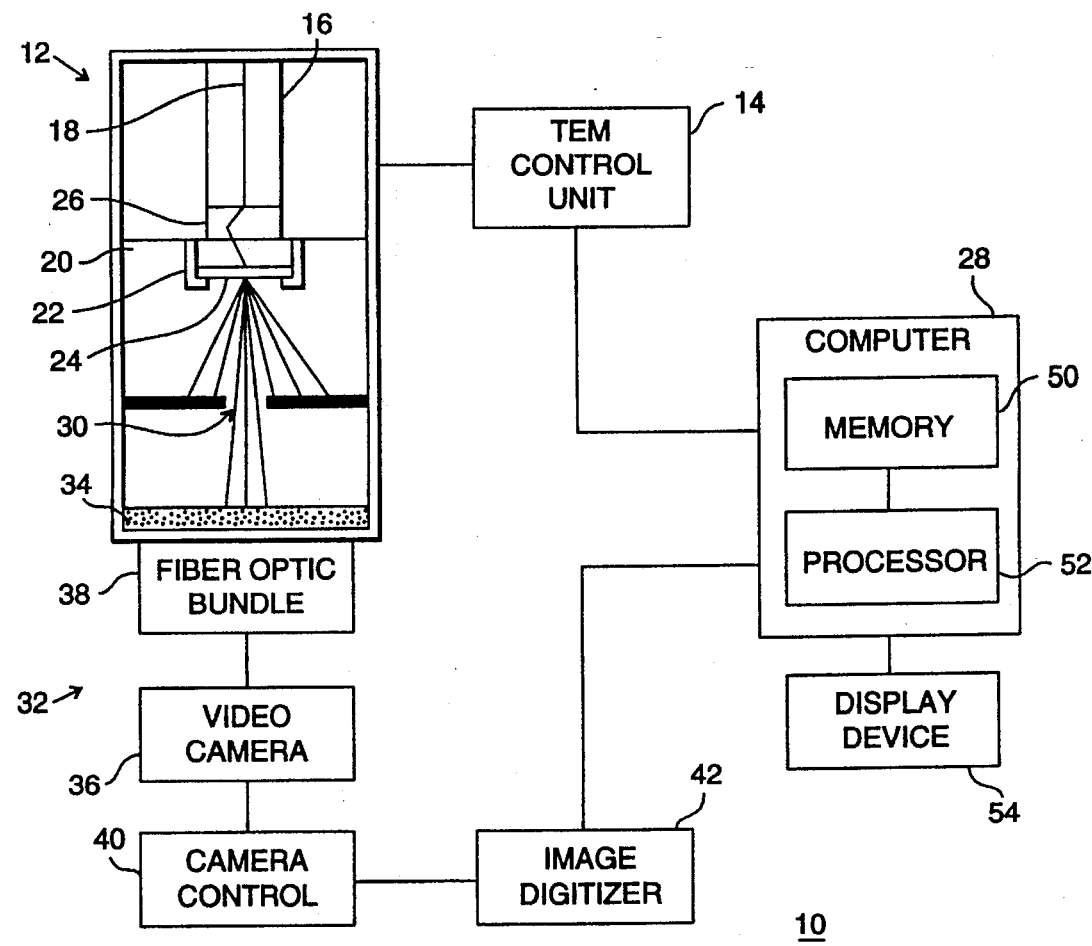
FIG. 1 shows a block diagram of an orientation apparatus for determining crystallographic characteristics of a specimen.

FIG. 1 is a block diagram of an orientation apparatus 10 for determining the orientation of a plurality of crystals within a specimen. Orientation apparatus 10 may also be adapted to detect and analyze crystal defects within an individual crystal. Orientation apparatus 10 incorporates a conventional transmission electron microscope (TEM) 12. TEM 12 includes a TEM control unit 14 that controls an electron beam generator 16. Under the direction of TEM control unit 14, electron beam generator 16 discharges a focused electron beam 18 into a vacuum chamber 20. A holding stage 22 is mounted in vacuum chamber 20 such that a material specimen 24 mounted thereon is bombarded or illuminated by electron beam 18. A beam deflector 26 adjusts the incident tilt angle and the incident azimuth angle of electron beam 18 (described in detail below). Beam deflector 26 is preferably under the control of a computer 28

(described below) via TEM control unit 14.

In the preferred embodiment, TEM 12 is operated to produce a plurality of high-resolution dark field images of specimen 24. Because dark field images are well known to those skilled in this art, they will not be described in detail herein. The different dark field images are obtained by adjusting the tilt and azimuth angles of electron beam 18. In a dark field image, only those crystals that satisfy specific diffraction conditions appear bright. For different combinations of tilt and azimuth angles, a portion of the diffracted electrons will be directed through an objective aperture 30. Objective aperture 30 is preferably aligned with the optical axis (not shown) of TEM 12, which results in improved imaging resolution. The various tilt and azimuth angle values are eventually utilized to determine the crystal orientation of specimen 24 (described below).

An image collection system 32 obtains the dark field images in response to the illumination of specimen 24. Image collection system 32 includes a screen 34 that is coated with a scintillating material such as phosphorus. Screen 34 is coupled to a video camera 36 through a fiber optic bundle 38. Screen 34 luminesces in accordance with the pattern of diffracted electrons falling thereon. The dark field images are captured by video camera 36, where they are converted to electronic signals, passed through a camera control unit 40, and converted into digital data in an image digitizer 42.

Figure 2:
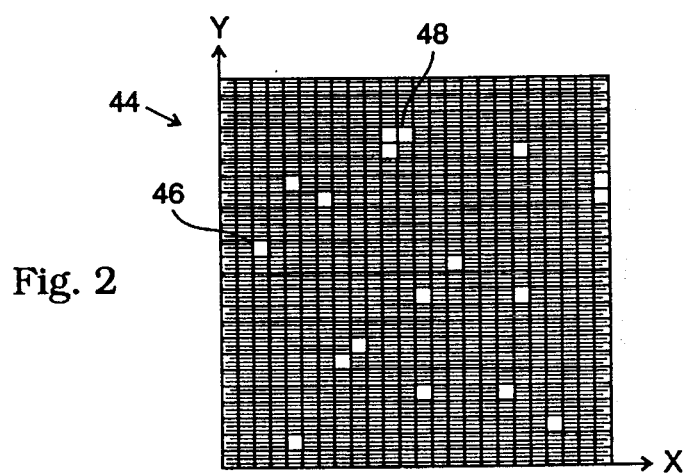
FIG. 2 shows a schematic view of a dark field image of the specimen as represented by a pixel array.

Referring to FIG. 2, a schematic view of a dark field image is shown represented by a pixel array 44. Although the preferred embodiment employs pixel array 44, the dark field images may be represented by any suitable collection of equivalent image regions. According to the preferred embodiment, each dark field image is digitized before being stored in computer 28. Each individual pixel illuminates with an associated pixel intensity. For example, a diffraction crystal may cause a pixel 46 or a group of pixels 48 in pixel array 44 to brighten. Each pixel has an identifying parameter associated therewith. In the preferred embodiment, pixel array 44 is defined by an (x,y) coordinate system and each pixel is identified by its unique (x,y) coordinate.

Referring again to FIG. 1 computer 28 controls the determination of crystallographic characteristics of specimen 24. Computer 28 is a conventional computer desirably having as much computing power as is economically practical. Computer 28 includes conventional computer components, including a memory 50 and a processor 52. Memory 50 stores programming instructions that define various processes carried out by processor 52 and other components of orientation apparatus 10. In addition, memory 50 stores data generated by the operation of orientation apparatus 10.

Computer 28 may be coupled to a display device 54 that produces an orientation image of the crystals within specimen 24. Display device 54 may be a video display terminal, a printer, or other device which may serve to convey crystal orientation information.

Figure 3:
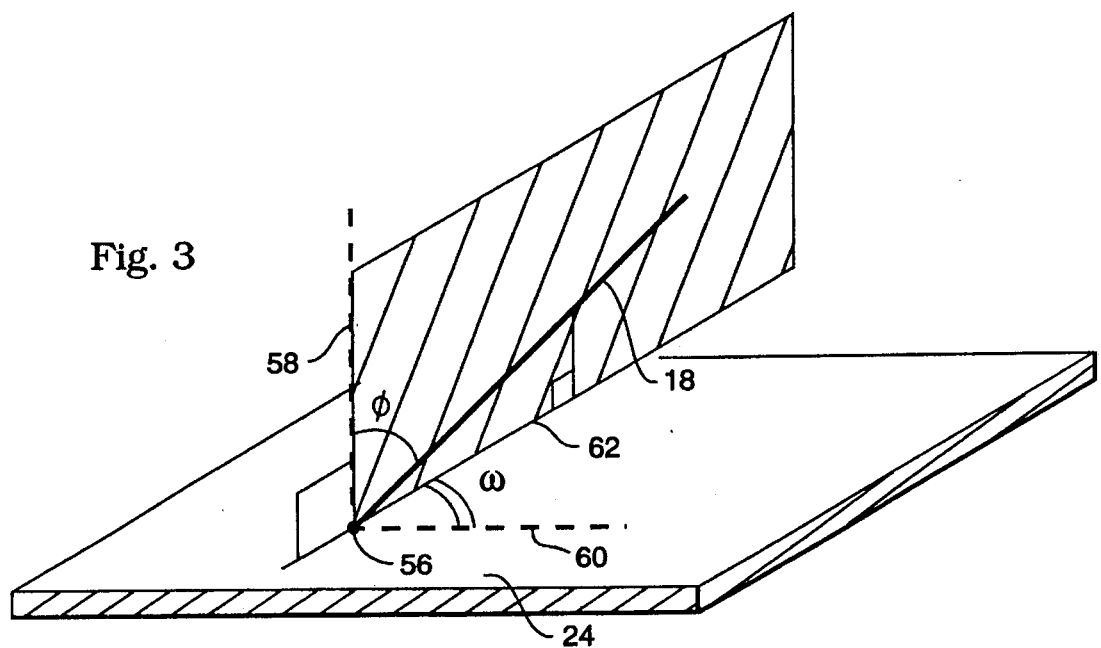
FIG. 3 shows an electron beam illuminating an area of a specimen.
Figure 4:
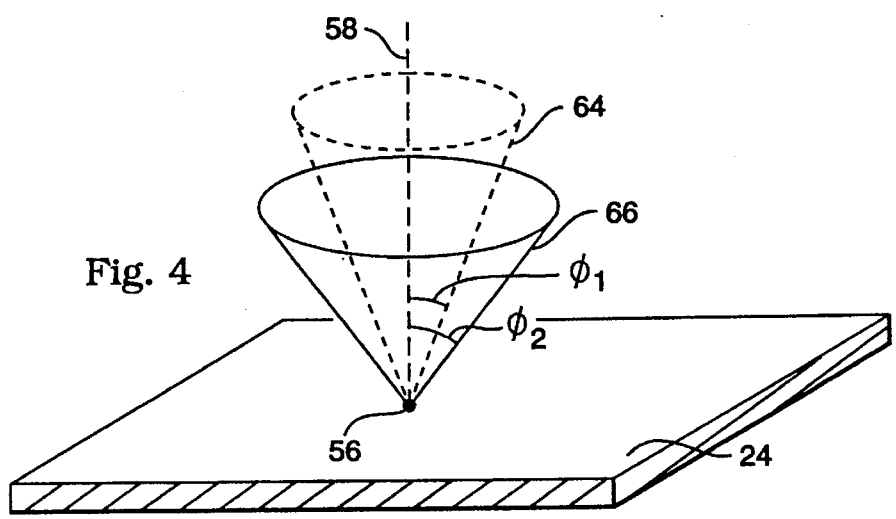
FIG. 4 depicts conical patterns traced by an electron beam under the control of the orientation apparatus.

Referring now to FIGS. 3–4, the tilt and azimuth angles associated with electron beam 18 are illustrated. As described briefly above in connection with FIG. 1, beam deflector 26 deflects electron beam 18 such that it illuminates specimen 24 at an area 56. Due to the microscopic dimensions involved, and for the sake of clarity, area 56 is depicted as a point on specimen 24. According to the preferred embodiment, electron beam 18 may be wide enough to illuminate hundreds of individual crystals within specimen 24. This configuration allows orientation apparatus 10 to determine the orientation of many crystals in a substantially simultaneous manner, rather than one at a time. When utilized for defect analysis, electron beam 18 illuminates one or more crystals that may include any number of defects.

The tilt angle ($\phi$) is measured relative to a reference line 58 normal to specimen 24 at area 56. Thus, the location of normal reference line 58 is dependent upon the location of area 56. As the tilt angle is varied, electron beam 18 remains focused at area 56. The azimuth angle ($\omega$) is measured relative to a reference line 60 parallel to the surface of specimen 24. Of course, the precise placement of parallel reference line 60 is arbitrary, and it may be chosen according to the specific application. As the azimuth angle ($\omega$) is varied, the projection 62 of electron beam 18 upon specimen 24 rotates about area 56. Those skilled in the art will appreciate that the tilt and azimuth angles may be alternatively defined according to other reference coordinates if desired.

During the operation of orientation apparatus 10, dark field images are obtained under different tilt angle ($\phi$) and azimuth angle ($\omega$) conditions (described in detail below). According to the preferred embodiment, the tilt angle is varied from about 0° to about 10° relative to normal reference line 58, and the azimuth angle is varied from about 0° to about 360° relative to parallel reference line 60. FIG. 4 depicts the "trace" formed as the tilt and azimuth angles of electron beam 18 are varied. For a tilt angle of $\phi_1$, electron beam 18 creates a conical trace 64 as the azimuth angle ($\omega$) is varied from 0° to 360°. For a different tilt angle of $\phi_2$, electron beam 18 creates a conical trace 66 as the azimuth angle ($\omega$) is varied from 0° to 360°. Conical traces 64, 66 present two examples of how electron beam 18 may be varied. The above description of the tilt and azimuth angle traces provides a convenient visualization of the deflection of electron beam 18, and is not a limitation on the present invention.

Generally, orientation apparatus 10 determines crystallographic characteristics such as the crystal orientation of specimen 24 by collecting and processing a plurality of dark field images under known electron beam tilt angle and azimuth angle conditions. The dark field images are represented by pixel array 44, and any given pixel may illuminate or brighten under several different beam deflection conditions. Those pixels that illuminate for at least three different beam deflection conditions are identified, and their locations are utilized (along with the known tilt angle and azimuth angle values) to identify and locate the diffraction lattice planes of the associated crystal. Eventually, orientation apparatus 10 generates a crystal orientation map of the portion of specimen 24 covered by electron beam 18.

The processes described below may also be implemented by orientation apparatus 10 to detect and analyze crystal defects within specimen 24. When illuminated with electron beam 18, defects within the sub-structure of one or more crystals may cause certain pixels of pixel array 44 to brighten. In other words, individual defects within crystals are analyzed in addition to or instead of individual crystals. The bright pixels are subsequently analyzed to locate and orient the various defects, if any exist, within specimen 24. Thus, those skilled in the art will appreciate that the following description also applies to the detection and analysis of crystallographic defects.

Referring to FIG. 5, an imaging process 68 performed by orientation apparatus 10 is depicted as a flow diagram. Process 68 is performed after specimen 24 is prepared according to conventional TEM procedures and mounted on stage 22. Process 68 begins with a task 70, which initializes the tilt angle and azimuth angle values of electron beam 18. Preferably, the initial tilt and azimuth angle values are each 0° relative to normal reference line 58 and parallel reference line 60, respectively (see FIG. 3). Following task 70, a task 72 causes TEM 12 to illuminate specimen 24 with electron beam 18. Upon illumination, certain crystals within specimen 24 diffract electron beam 18 at specific angles. As shown in FIG. 1, diffracted electrons that react with these certain crystals pass through objective aperture 30 and impinge upon screen 34. Diffracted electrons from other crystals will not pass through objective aperture 30.

After task 72, a task 74 obtains a dark field image associated with the current beam deflection angles. The dark field image, which contains bright spots corresponding to the diffraction crystals, is produced on screen 34. Following task 74, a task 76 collects an electronic representation of the dark field image as defined by pixel array 44 (see FIG. 2). Each pixel, or contiguous group of pixels, may represent an image region for purposes of the present invention. For simplicity, the following description uses a single pixel as an image region. Task 76 may be performed by image collection system 32 and image digitizer 42. After task 76, imaging process 68 begins to analyze the individual pixels in pixel array 44.

Following task 76, a task 78 gets an initial pixel from the current image. For example, task 78 may get the pixel identified by the (0,0) coordinate location (see FIG. 2). Following task 78, a query task 80 determines whether the pixel intensity level ($\psi$) is greater than a predetermined minimum intensity level. Thus, imaging process 68 preferably selects those pixels having an intensity greater than the predetermined intensity level, i.e., bright pixels. If query task 80 determines that the intensity level for the current pixel exceeds the threshold pixel intensity level, then a task 82 is initiated.

Figure 6:
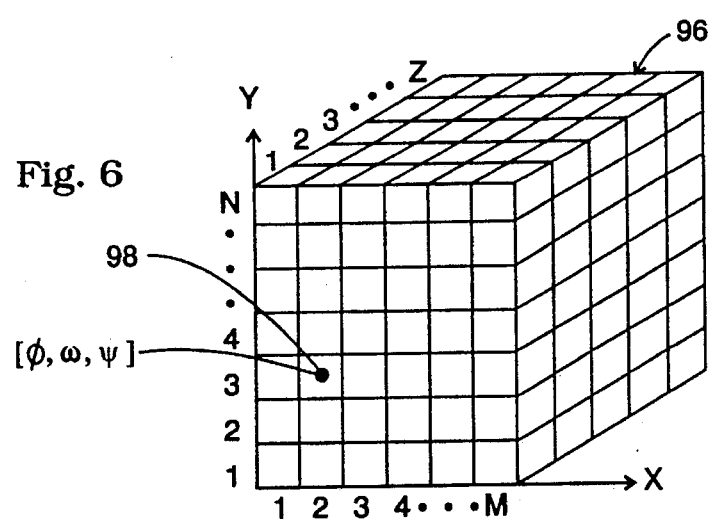
FIG. 6 shows an exemplary data storage matrix employed by the imaging process depicted in FIG. 5.

Task 82 stores data related to the current bright pixel in memory 52, which serves as a data store. With reference to FIG. 6, the data store may, for example, be visualized as a three dimensional matrix 96. For each bright pixel, task 82 stores the associated tilt angle ($\phi$), azimuth angle ($\omega$), and pixel intensity level ($\psi$). The pixel itself is identified by its (x,y) coordinate. Matrix 96 represents a pixel array having M X N dimensions, where M and N define the number of pixels (or image regions) collected in the x and y dimensions, respectively. For purposes of illustration, matrix 96 is shown with the (2,3) pixel location 98 having data stored therein. It is known to those skilled in electron microscopy and crystallography that a single crystal plane may theoretically diffract up to six times as the tilt and azimuth angles of electron beam 18 are varied. In addition, erroneous double diffraction at a single crystal may cause a pixel to brighten yet another time. Thus, a given pixel may be bright for a plurality of different images due to the inherent diffraction characteristics of the crystal lattice structure. As such, matrix 96 is configured to store up to Z sets of data for each pixel in the array, where Z can be any appropriate integer value (preferably between four and eight). These storage slots are depicted as a third matrix dimension in FIG. 6, and may have a count associated therewith. For purposes of illustration, matrix 96 may have dimensions of 512×512×6, which allows for each image having about 260,000 pixels. The (x,y) coordinate, the tilt angle value, and the azimuth angle value are utilized in a process described below to determine the orientation of the crystal associated with the current bright pixel.

Following task 82, and if query task 80 determines that the pixel intensity is not greater than the threshold intensity level, a query task 84 begins (see FIG. 5). Query task 84 tests whether the current pixel is the last pixel in the present image. If query task 84 determines that at least one pixel remains in the current image, then a task 86 gets the next pixel and reenters imaging process 68 at task 80. Thus, each pixel in the current image is analyzed to determine whether or not it exceeds the threshold intensity level. If query task 84 determines that the current pixel is the last pixel in the image, then a query task 88 is initiated.

Query task 88 tests whether the current azimuth angle value equals the maximum azimuth angle value for the particular application. Preferably, orientation apparatus varies the azimuth angle through approximately 360°, thus $\omega_{max}=360°$ for the preferred embodiment. If query task 88 determines that $\omega \neq \omega_{max}$, then a task 90 is initiated. Task 90 increments the azimuth angle value by a predetermined amount. The azimuth angle step size may depend upon the desired orientation image resolution, the size of objective aperture 30, or other operating factors. Following task 90, imaging process 68 is reentered at task 72 to illuminate specimen 24 under the new deflection conditions. If query task 88 determines that $\omega=\omega_{max}$, then a query task 92 begins.

Query task 92 tests whether the tilt angle value equals the maximum tilt angle value. Preferably, orientation apparatus 10 varies the tilt angle from about 0° to about 10° relative to normal reference line 58 (see FIG. 3). Thus, $\phi_{max}=10°$ for the preferred embodiment. If query task 92 determines that $\phi \neq \phi_{max}$, then a task 94 is initiated. Task 94 increments the tilt angle value by a predetermined amount. Similarly to the azimuth angle step size, the specific tilt angle step size may depend upon various operating factors. Following task 94, imaging process 68 is reentered at task 72 to re-illuminate the specimen.

As described above, the core of imaging process 68 is repeated for different combinations of tilt and azimuth angle values. If query task 92 determines that the current tilt angle value is equal to the maximum tilt angle value, then process 68 ends. Although the preferred embodiment has been described along with a specific electron beam deflection technique, the present invention is not limited to the described technique. At the conclusion of process 68, a plurality of dark field images have been obtained and data related to the tilt and azimuth angles that produced bright pixel intensities have been stored in memory 50 for each applicable pixel.

Tasks 72, 74, and 76 may occur for the next dark field image while the remainder of process 68 is evaluating the current dark field image. Those skilled in the art will appreciate that imaging process 68 enables the "parallel" processing of many dark field images, which is desirable to allow orientation apparatus 10 to generate a useful orientation image in a reasonable amount of time. However, it should be understood that the present invention is not limited to the specific process described above. For example, several individual pixels may be analyzed as a group to speed up the processing time. Such an option may be desirable if very high resolution is not necessary. In addition, process 68 may share certain tasks or be combined with other processes described herein or known to those skilled in this art.

Figure 7:
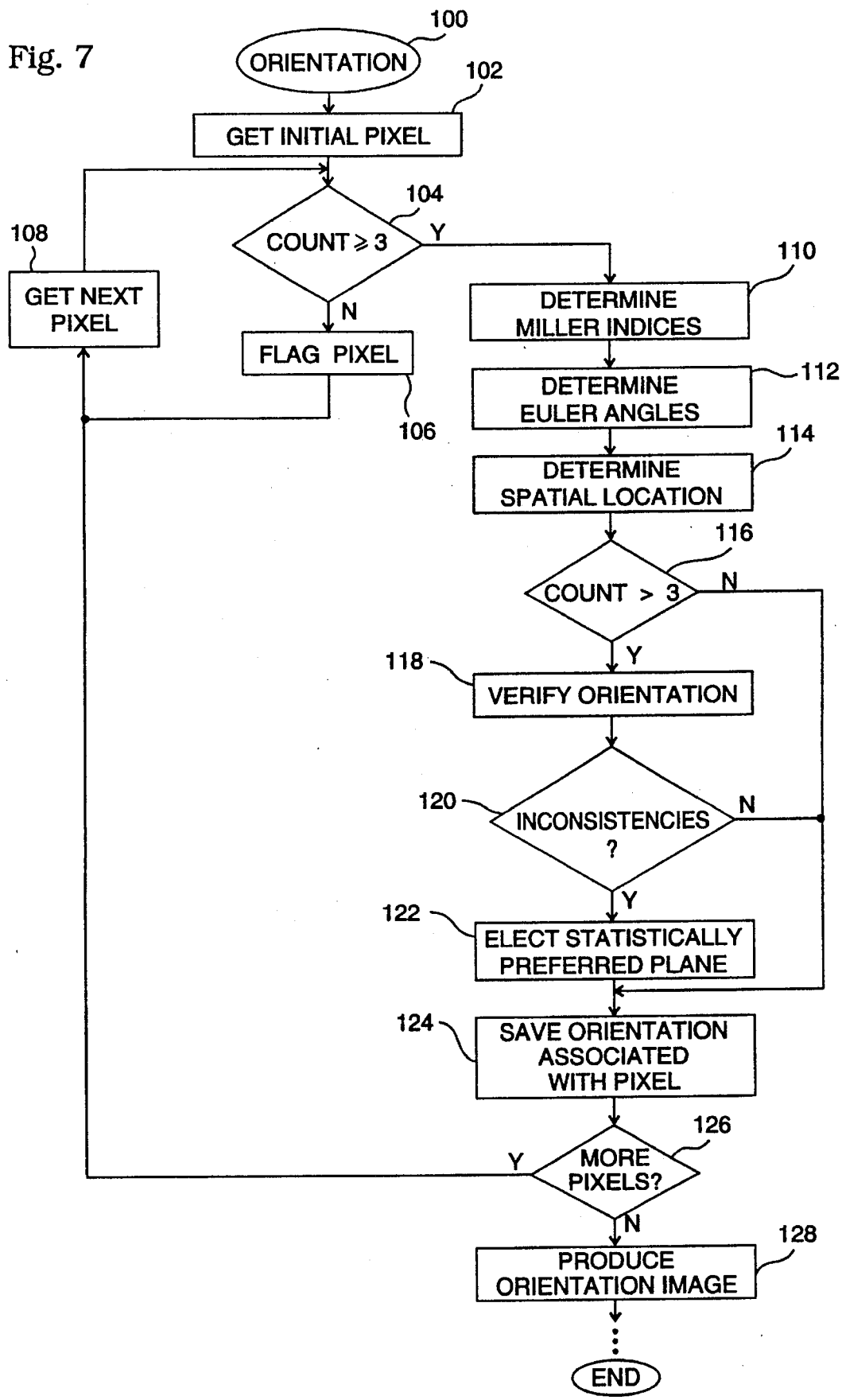
FIG. 7 is a flow diagram of an orientation process performed by the orientation apparatus.

After all of the images are analyzed, orientation apparatus 10 proceeds to identify the crystal lattice planes associated with the crystals of specimen 24. Referring to FIG. 7, an orientation process 100 performed by computer 28 is depicted as a flow diagram. Process 100 is also performed during defect detection and analysis (as described above).

Process 100 begins with a task 102, which gets an initial pixel from matrix 96 stored in memory 50. For example, task 102 may get the pixel identified by the (0,0) coordinate location. Following task 102, a query task 104 determines whether the pixel was bright for at least three different electron beam deflection conditions. As described above in connection with FIG. 6, the number of times a single pixel brightens may be indicated by a count. Thus, process 100 preferably designates a pixel having a specific (x,y) coordinate that was bright for at least three different obtained dark field images. The three different bright conditions are utilized to determine three unknown variables related to the crystal orientation (described below). Those skilled in the crystallography art will recognize that only two different bright conditions may be utilized if desired, however such use may lead to ambiguous results due to the mathematics involved. Of course, the present invention is not limited to the use of three independent bright conditions, and the processes described herein may be modified to determine the orientation of a crystal associated with a pixel that is bright for only two different beam deflection conditions.

If query task 104 determines that the pixel count is less than three, then a task 106 is prompted. Task 106 flags the current pixel location to indicate that a crystal orientation at that particular location will not be determined. Such a condition may occur if specimen 24 has a void, defect, dislocation, or grain boundary at the location associated with the current pixel. Following task 106, a task 108 gets the next pixel for analysis and orientation process 100 is subsequently reentered at query task 104. If query task 104 determines that the current pixel was bright for at least three different dark field images, then a task 110 begins.

Task 110 determines the Miller indices of the diffraction crystal lattice plane associated with the current pixel. Briefly, the Miller indices identify the location of crystal lattice planes relative to a unit crystal. Miller indices are expressed as three numbers: (h,k,l). As briefly referred to above, the three known bright conditions are utilized to solve for the Miller indices. The Miller indices may be calculated from the known tilt angle and azimuth angle values using various equations and relationships (such as the Bragg diffraction condition) that are well known to those skilled in this art. In addition, task 110 may employ other known parameters such as the wavelength of electron beam 18, the atomic lattice parameter for specimen 24, and the theoretical distance between the crystal lattice planes. Each crystal class has a different set of equations and relationships, which will not be described in detail herein. Following task 110, a task 112 begins.

Task 112 determines the Euler angles of the crystal associated with the current pixel. In general, three Euler angles fully define the orientation of a single crystal. In the preferred embodiment, the Miller indices obtained in task 110 are utilized to calculate the Euler angles. Again, the equations and relationships between the Miller indices and the Euler angles are well known in this art, and need not be described in detail herein. Although the identity of the crystal lattice plane is determined in task 110, the rotational aspect of the plane is still undefined. For purposes of the present invention, an unknown rotational aspect gives the crystal a rotational degree of freedom. The Euler angles determined in task 112 define the relative rotational aspect of the crystal, and task 112 completes the orientation analysis of the crystal associated with the current pixel. After task 112, a task 114 is initiated.

Task 114 determines the relative spatial location of the crystal associated with the current pixel. As described above, each pixel is preferably identified by its (x,y) coordinate. This data, along with the known geometry of TEM 12, is utilized to determine the spatial location of the crystal within specimen 24 using well known trigonometric calculations. Thus, after task 114, the location and orientation of an individual crystal is known. Following task 114, a query task 116 is initiated.

Query task 116 determines if the current bright pixel has a count of more than three, i.e., whether the pixel was bright for more than three different dark field images. If query task 116 determines that the count for the current pixel is more than three, then a task 118 is prompted. Task 18 utilizes the "surplus" bright conditions to verify the orientation determined by tasks 110, 112, and 114. Task 118 serves as a check point, and may also serve to provide statistical confidence data (not shown). Preferably, task 118 repeats the orientation analysis for all possible groupings of three bright pixel conditions. Following task 118, a query task 120 is initiated.

Query task 120 determines whether task 118 identified any inconsistent crystal orientations for a single theoretical crystal. Ideally, each orientation analysis performed during task 118 will produce the same result as tasks 110, 112, and 114. However, due to various circumstances such as double diffraction, poor specimen preparation, or equipment limitations, the different orientations determined by task 118 may not be consistent. Thus, if query task 120 determines that inconsistencies are present, then a task 122 is initiated. Task 122 elects a statistically preferred crystal lattice plane, i.e., task 122 chooses the calculated orientation having the highest occurrence. Following task 122, a task 124 saves the orientation associated with the current pixel.

Task 124 is also prompted if query task 116 determines that the pixel count is not greater than three. Thus, if a pixel is bright for only three different conditions, then only one orientation calculation may be made, and no verification is possible. Orientation process 100 may include a low confidence indicator (not shown) to flag such occurrences. Task 124 is also prompted if query task 120 determines that the orientations calculated in task 118 are not inconsistent. In other words, task 122 (electing the preferred orientation) is bypassed if no inconsistencies are present.

Following task 124, a query task 126 tests whether more pixels remain to be analyzed. If query task 126 determines that at least one more pixel remains to be analyzed, then task 108 is initiated. As described above, task 108 gets the next pixel for analysis. Following task 108, orientation process 100 is reentered at query task 104 to determine whether the new pixel was bright for at least three different bright field images. If query task 124 determines that all of the pixels have been analyzed, then a task 128 is initiated.

Task 128 produces an orientation image based on the individual crystal orientations previously determined. Task 128 combines the results into an orientation map that represents the orientation of up to hundreds of individual crystals. Task 128 is similar to the production of orientation images using known scanning electron microscope techniques. In accordance with one aspect of the preferred embodiment, task 128 generates an indicator, such as a visible marker, for those spatial locations where no crystal orientations were determined (see above description of task 106). In addition, a statistical confidence map may be generated to indicate the reliability of the orientation calculations at certain areas of specimen 24. The orientation image may be formatted for display at a video terminal, printed as a tangible copy, or stored in memory 52 of computer 28. Following task 128, orientation process 100 ends.

In summary, an improved apparatus and method for determining crystallographic characteristics such as the crystal orientation of a material are provided by the present invention. The preferred embodiment allows the crystal orientation of a material to be determined with a resolution beyond the practical limits of a scanning electron microscope. The preferred embodiment is capable of determining the orientation of a large number of crystals in a relatively short time by utilizing parallel data acquisition and manipulation techniques. In addition, the present invention may be adapted to detect and analyze substructural defects.

The above description is of a preferred embodiment of the present invention, and the invention is not limited to the specific embodiment described and illustrated. For example, conventional TEM components are only generally described, and the specific apparatus may vary according to individual applications. The tilt and azimuth angle reference lines and sweep traces, and the data store matrix have been illustrated and described for the sake of clarity, and the present invention is not limited to any specific configurations. In addition, the different processes described herein, and the ordering of specific tasks, may be modified or changed to produce equivalent results. Furthermore, many variations and modifications will be evident to those skilled in this art, and such variations and modifications are intended to be included within the spirit and scope of the invention, as expressed in the following claims.

What is claimed is:

1. A method for determining crystallographic characteristics throughout a specimen having one or more crystals, said method comprising the steps of:

obtaining a plurality of dark field images of said specimen;

defining, for each of said dark field images, a plurality of image regions, each of said image regions being related to at least one of said one or more crystals;

analyzing said image regions to identify a plurality of crystal lattice planes associated with said one or more crystals;

determining a relative spatial location for each of said one or more crystals; and determining a relative rotational aspect for each of said one or more crystals.

2. A method according to claim 1, further comprising the step of producing an orientation image that represents a crystal orientation of said specimen, said producing step occurring after said analyzing step.

3. A method according to claim 1, wherein each of said image regions comprises at least one pixel.

4. A method for determining crystallographic characteristics of a specimen having one or more crystals, said method comprising the steps of:

illuminating an area of said specimen with an electron beam having a controllable tilt angle value and a controllable azimuth angle value associated therewith;

obtaining a dark field image of said specimen in response to said illuminating step;

repeating said illuminating and obtaining steps for a plurality of combinations of said tilt angle value and said azimuth angle value for obtaining a plurality of dark field images; and analyzing said obtained dark field images, said tilt angle values, and said azimuth angle values to identify a plurality of crystal lattice planes associated with said crystals.

5. A method according to claim 4, further comprising the steps of:

determining a relative spatial location for each of said one or more crystals; and determining a relative rotational aspect for each of said one or more crystals.

6. A method according to claim 5, wherein said tilt angle values and said azimuth angle values are incremented in predetermined steps.

7. A method according to claim 5, wherein said illuminating step illuminates an area encompassing a multiplicity of individual crystals within said specimen.

8. A method according to claim 4, wherein each of said obtained dark feild images is comprised of a plurality of pixels each having an identifying parameter assigned thereto, and said method further comprises the steps of:

selecting, for different ones of said obtained dark field images, those of said pixels having an intensity greater than a predetermined intensity;

storing said identifying parameter, said tilt angle value, and said azimuth angle value associated with each of said selected pixels; and designating those of said selected pixels having substantially equivalent identifying parameters for a plurality of said obtained dark field images.

9. A method according to claim 8, wherein said analyzing step is performed for those of said pixels designated in said designating step.

10. A method according to claim 8, further comprising the step of determining a relative spatial location for each of said plurality of crystal lattice planes, said determining step utilizing said identifying parameters.

11. A method according to claim 8, wherein:

said method further comprises the step of verifying the identity of an identified crystal lattice plane;

said verifying step occurs for one of said designated pixels having substantially equivalent identifying parameters for more than a predetermined number of different ones of said obtained images; and said verifying step occurs after said analyzing step.

12. A method according to claim 11, wherein:

said method further comprises the step of electing a statistically preferred crystal lattice plane; and said electing step occurs when said verifying step inconsistently identifies a crystal lattice plane.

13. A method according to claim 4, further comprising the step of producing an orientation image that represents a crystal orientation of said specimen, said producing step occurring after said analyzing step.

14. A method according to claim 4, wherein said tilt angle value varies from approximately 0° to approximately 10° relative to a reference line normal to said specimen at said area.

15. A method according to claim 4, wherein said azimuth angle value varies from approximately 0° to approximately 360° relative to a reference line parallel to the surface of said specimen.

16. An apparatus for determining crystallographic characteristics of a specimen having one or more crystals, said apparatus comprising;

an electron beam generator for generating an electron beam;

a beam deflector for adjusting a tilt angle value of said electron beam relative to a reference line normal to said specimen and for adjusting an azimuth angle value of said electron beam relative to a reference line parallel to the surface of said specimen;

a stage for holding said specimen;

an image collection system for obtaining a plurality of dark field images of said specimen, wherein said dark field images are produced by the illumination of said specimen by said electron beam and wherein different ones of said dark field images are obtained with different combinations of said tilt angle value and said azimuth angle value; and means for processing said dark field images to identify a plurality of crystal lattice planes associated with said crystals, said means for processing being in data communication with said image collection system.

17. An apparatus according to claim 16, wherein:

each of said dark field images is comprised of a plurality of pixels; and said means for processing is configured to select those of said pixels having an intensity greater than a predetermined intensity.

18. An apparatus according to claim 19, further comprising a data store configured to store data associated with said dark field images, said tilt angle values, and said azimuth angle values, said data store being in data communication with said means for processing.

19. A method for determining crystallographic characteristics throughout a specimen having one or more crystals, said method comprising the steps of:

obtaining a plurality of dark field images of said specimen;

defining, for each of said dark field images, a plurality of image regions, wherein each of said image regions comprises at least one pixel having an identifying parameter assigned thereto, and each of said image regions is related to at least one of said one or more crystals;

selecting, for different ones of said obtained dark field images, those of said pixels having an intensity greater than a predetermined intensity;

storing said identifying parameter for each of said selected pixels;

designating those of said selected pixels having substantially equivalent identifying parameters for a plurality of said obtained dark field images; and analyzing said image regions to identify a plurality of crystal lattice planes associated with said one or more crystals.

20. A method for determining crystallographic characteristics throughout a specimen having one or more crystals, said method comprising the steps of:

obtaining a plurality of dark field images of said specimen;

defining, for each of said dark field images, a plurality of image regions, each of said image regions being related to at least one of said one or more crystals;

analyzing said image regions to identify a plurality of crystal lattice planes associated with said one or more crystals;

determining the Miller indices associated with each of said crystal lattice planes; and determining, from said Miller indices, the Euler angles associated with each of said one or more crystals.

* * * * *

UNITED STATES PATENT AND TRADEMARK OFFICE
CERTIFICATE OF CORRECTION

PATENT NO. : 5,576,543
DATED : 19 November 1996
INVENTOR(S) : David J. Dingley

It is certified that error appears in the above-indentified patent and that said Letters Patent is hereby corrected as shown below:

In Column 10, Line 14, please delete "feild" and insert --field-- therefor

In Column 10, Line 40, please insert --dark field-- between "obtained" and "images"

In Column 11, Line 22, please delete "19" and insert --16--

Signed and Sealed this

Fourth Day of February, 1997

Attest:

BRUCE LEHMAN

Attesting Officer  Commissioner of Patents and Trademarks